United States Patent [19]

Nishizawa et al.

[11] 4,333,989
[45] Jun. 8, 1982

[54] SAPPHIRE SINGLE CRYSTAL SUBSTRATE CONSISTING ESSENTIALLY OF $GA_2O_3$ FOR SEMICONDUCTOR DEVICES

[75] Inventors: Jun-Ichi Nishizawa; Kitsuhiro Kimura, both of Sendai, Japan

[73] Assignee: Semiconductor Research Foundation, Sendai, Japan

[21] Appl. No.: 167,757

[22] Filed: Feb. 22, 1982

Related U.S. Application Data

[60] Continuation of Ser. No. 947,851, Oct. 2, 1978, abandoned, which is a division of Ser. No. 625,527, Oct. 24, 1975, Pat. No. 4,126,731.

[30] Foreign Application Priority Data

Oct. 26, 1974 [JP] Japan ................. 49/123616

[51] Int. Cl.$^3$ ............................................. C30B 29/20
[52] U.S. Cl. ........................... 428/446; 428/700; 501/86; 501/153
[58] Field of Search ............... 428/700, 446; 106/42

[56] References Cited

U.S. PATENT DOCUMENTS

| | | | |
|---|---|---|---|
| 3,075,831 | 1/1963 | Remeika | 156/DIG. 61 |
| 4,039,726 | 8/1977 | Carr | 428/700 |
| 4,177,321 | 12/1979 | Nishizawa | 428/700 |

*Primary Examiner*—John D. Smith
*Attorney, Agent, or Firm*—Frishauf, Holtz, Goodman & Woodward

[57] ABSTRACT

A single crystal substrate for epitaxial growth thereon of a semiconductor layer. The substrate consisting essentially of sapphire (aluminum oxide) and at least one additive selected from a group consisting of oxides of gallium. A 87 mol percent content of gallium oxide is most preferred for a silicon layer. Similarly, an additive and its content should most preferably be selected depending on the semiconductor, which may be gallium phosphide, aluminium phosphide, or zinc sulphide.

3 Claims, 3 Drawing Figures

SAPPHIRE SINGLE CRYSTAL SUBSTRATE CONSISTING ESSENTIALLY OF GA₂O₃ FOR SEMICONDUCTOR DEVICES

This is a continuation of application Ser. No. 947,851 filed Oct. 2, 1978, which, in turn, is a division of Ser. No. 625,527, filed Oct. 24, 1975, now U.S. Pat. No. 4,126,731, issued Nov. 21, 1978.

BACKGROUND OF THE INVENTION

This invention relates to a single crystal substrate of an electrically insulating material for epitaxial growth thereon of a semiconductor layer. A substrate according to this invention is therefore for use in manufacturing semiconductor devices.

A substrate of an electrically insulating material is theoretically welcomed for epitaxial growth thereon of a semiconductor layer. This is because the substrate affords excellent electric insulation between the device elements of an integrated circuit formed by the use of the semiconductor layer and eliminates the undesired parasitic capacitance. A sapphire ($Al_2O_3$) or a spinel ($mgAl_2O_3$) single crystal has been used as a substrate of the type described. There is, however, a considerable lattice mismatch between the substrate single crystal and the epitaxially grown semiconductor single crystal. The mismatch results in stress latent in the semiconductor layer and dislocation in the semiconductor single crystal to render the semiconductor crystal imperfect and heterogenaous and to adversely affect the electrical characteristics of the semiconductor layer, such as mobility and lifetime of charge carriers, and of the semiconductor devices manufactured by the use of the semiconductor layer.

In Japanese Patent Application No. Syô 47-74483 filed July 25, 1972, and laid open to public on Mar. 28, 1974, Jun-ichi Nishizawa, one of the present inventors, has taught a combination of a substrate of the type described and a semiconductor layer epitaxially grown thereon. The lattice mismatch in question is reduced in general in accordance with Nishizawa by changing the composition of at least one of the substrate and the layer of the combination. In the meantime, Jun-ichi Nishizawa and Mitsuhiro Kimura, the instant inventors, have disclosed in U.S. patent application Ser. No. 600,007 filed July 29, 1975 now U.S. Pat. No. 3,990,902, a spinel single crystal substrate of the type described wherein the mismatch is reduced more specifically.

A preferred substrate, however, has not been known, which consists of a sapphire containing single crystal and is for use in epitaxially growing thereon a semiconductor layer with the lattice mismatch reduced to an admissible extent.

SUMMARY OF THE INVENTION

It is therefore an object of the present invention to provide a primarily sapphire single crystal substrate for epitaxial growth thereon of a semiconductor layer wherein a lattice mismatch is reduced to an admissible extent.

It is another object of this invention to provide a sapphire containing single crystal substrate of the type described, on which it is possible to epitaxially grow a most perfect and homogeneous semiconductor layer.

It is still another object of this invention to provide a sapphire containing single crystal substrate of the type described, which does not adversely affect the electrical characteristics of semiconductor devices manufactured thereon.

It is a specific object of this invention to provide a sapphire containing single crystal substrate of the type described, wherein a particular substance is definitely used to achieve the objects of this invention enumerated in the three next preceding paragraphs.

In accordance with this invention there is provided a single crystal substrate for epitaxial growth thereon of a semiconductor layer wherein the single crystal consists of aluminum oxide ($Al_2O_3$) and a member selected from the group consisting of gallium oxide ($Ga_2O_3$), titanium oxide ($Ti_2O_3$), scandium oxide ($Sc_2O_3$), chromium oxide ($Cr_2O_3$), iron oxide ($Fe_2O_3$), magnesium titanium oxide ($MgTiO_3$), and iron titanium oxide ($FeTiO_3$). The sapphire containing single crystal mentioned above therefore means an additive-containing sapphire single crystal.

DESCRIPTION OF THE PREFERRED EMBODIMENTS

Figure 1:
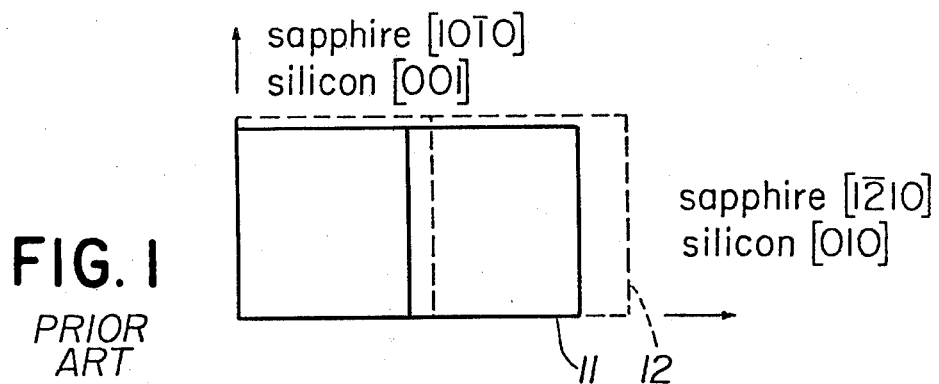
FIG. 1 schematically shows a conventional sapphire substrate and a silicon layer epitaxially grown thereon.

Referring to FIG. 1, a small portion of a sapphire single crystal 11 is depicted by solid lines and a corresponding portion of a silicon single crystal 12, by broken lines. A horizontal axis of the figure shows a [1 $\bar{2}$ 1 0] axis of the sapphire crystal 11 and also a [0 1 0] axis of the silicon crystal 12. A vertical axis represents a [1 0 $\bar{1}$ 1] axis of the sapphire crystal 11 and a [0 0 1] axis of the silicon crystal 12. The plane of the figure represents a lattice plane [$\bar{1}$ 1 0 2] of the sapphire crystal 11 and a lattice plane [1 0 0] of the silicon crystal 12. It is already known that a silicon layer 12 epitaxially grows on a sapphire single crystal substrate 11 with the (1 0 0)plane of the former brought on the ($\bar{1}$ 1 0 2) plane of the latter. Lattice distance of sapphire along its [1 $\bar{2}$ 1 0] and [1 0 $\bar{1}$ 1] axes are 4.75 Å and 5.2 Å, respectively. The lattice constant of silicon (cubic system) is 5.43 Å. In contrast to "lattice constant," the term "lattice distance" means the distance between two adjacent lattice planes along a direction which may not necessarily be the direction of a crystallographic axis.

In order to quantitatively speak of the degree of a lattice mismatch, a misfit coefficient is defined herein for a combination of sapphire and silicon by:

$$\frac{\text{lattice constant of silicon} + \text{lattice distance of sapphire}}{(\text{lattice constant of silicon} - \text{lattice distance of sapphire})/2} \times 100.$$

By using the above-cited numerical values of the respective lattice distances and constant, the misfit coefficients between the (1 0 0) plane of silicon and the ($\bar{1}$ 1 0 2) plane of sapphire are 13.4% and 4.3% in the directions of the horizontal and vertical axes depicted in FIG. 1, respectively. It follows therefore that a considerable lattice mismatch is present even along the illustrated vertical axis. This results in various disadvantages described in the preamble of the instant specification.

Figure 2:
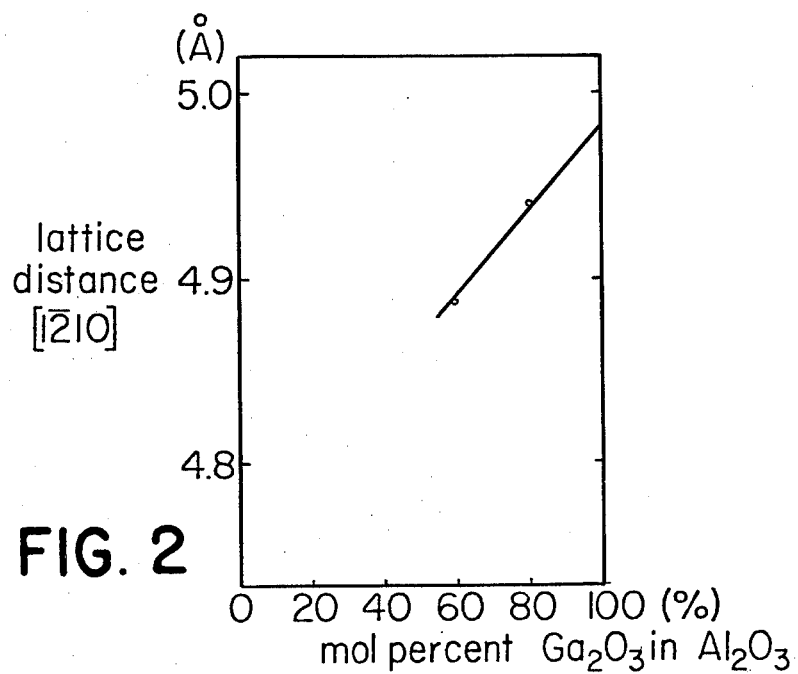
FIG. 2 shows how a lattice distance varies when gallium oxide is substituted for a portion of aluminum oxide of sapphire.

Referring to FIG. 2, it has now been determined that the lattice distance of sapphire along the [1 $\bar{2}$ 1 0] axis varies as shown therein when gallium oxide is substituted as an additive for a portion of aluminium oxide of which sapphire consists. It has also been found that such an additive-containing sapphire crystal retains its rhombohedral structure and accordingly the single crystal feature even with a considerable amount of the additive being substituted for the aluminium oxide provided that a single crystal grown at a high temperature as will later be described is quenched from a temperature range lower than about 1000° C. On the other hand, it has been confirmed that the lattice distance of an additive-containing sapphire single crystal along the [1 0 $\bar{1}$ 1] axis is lengthened in substantially linear relation to that along the [1 $\bar{2}$ 0 1] axis with an increase in the mol percentage of the gallium oxide.

Figure 3:
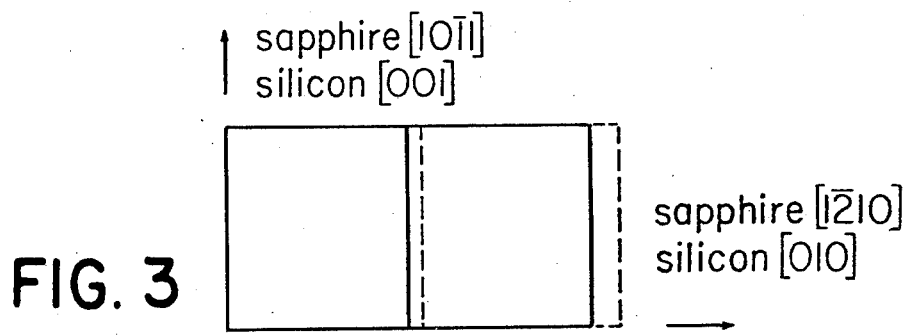
FIG. 3 schematically illustrates a sapphire containing single crystal substrate according to an embodiment of the instant invention and a silicon layer epitaxially grown thereon.

Turning to FIG. 3, which is similar to FIG. 1, the lattice distance of an additive-containing sapphire single crystal along the [1 0 $\bar{1}$ 1] axis (vertical) would become approximately 5.43 Å when the gallium oxide content is about 87 mol percent. As a result, the misfit coefficient in the [1 0 $\bar{1}$ 1] direction would be rendered approximately zero although there is a considerable lattice mismatch remaining along the [1 $\bar{2}$ 0 1] axis.

Sapphire containing about 85 mol percent of gallium oxide has a melting point at 1800° C. It is therefore feasible to apply the floating zone method to growing an additive-containing sapphire single crystal. In fact, powder was prepared which consists of 13 mol percent of aluminium oxide ($Al_2O_3$) and 87 mol percent of gallium oxide ($Ga_2O_3$), thoroughly mixed, and pressed into a mass of a rod shape. The mass was sintered in air at 1300° C. for twenty-four hours into a ceramic rod. With a seed crystal and an infrared-ray furnace, the floating zone method was resorted to so as to grow a single crystal of additive-containing sapphire on the seed crystal from the ceramic rod at a rate of crystal growth of 1 mm/hour and with the ceramic rod rotated at 90 r.p.m. Quenching was carried out in the furnace immediately after the growth of the single crystal. The crystal thus made was of homogeneous composition all over. An additive-containing sapphire single crystal of homogeneous composition can be manufactured also by the chemical deposition method, the Czochralski method, the edge-defined film fed growth method (EFG method), or the like method. With the EFG method capable of growing a single crystal at a higher rate, it is possible to further raise the distribution coefficient of the additive in an additive-containing sapphire single crystal by selection of an adequate rate of the crystal growth. Furthermore, it is possible to raise the homogeneity by adjusting the composition of the molten zone of the growing crystal.

By the use of a substrate made of an additive-containing sapphire single crystal produced as above by adoption of the floating zone method, a silicon single crystal was grown to a thickness of one micron epitaxially on the substrate from the vapour phase by thermal decomposition of monosilane. The silicon single crystal layer thus made had a perfect and homogeneous crystal structure even at its portion adjacent to the interface between the silicon layer and the substrate and showed excellent electrical characteristics. More particularly, an n-type silicon single crystal layer was formed on a substrate according to this invention with phosphine added to the monosilane. At a carrier concentration below $2 \times 10^{15}/cm^3$, the mobility of charge carriers in the n-type silicon layer was 800 $cm^2/(V.sec)$ or more in contrast to the corresponding value of about 500 $cm^2/(V.sec)$ for a silicon single crystal layer formed on a conventional sapphire substrate. Similarly, a p-type silicon single crystal layer was made on a substrate according to this invention. A leakage current between a source and a drain electrode of a p-channel MOS device manufactured by the use of the p-type silicon layer was only about 0.1 picoampere per micron, which value is about a tenth of that of the device made by the use of a p-type silicon single crystal layer formed on a conventional sapphire substrate. It is possible to use a substrate according to this invention for manufacturing semiconductor memory elements of the SOS and/or MOS structure thereon.

Almost the same desirable results were obtained when the misfit coefficient along the [1 0 $\bar{1}$ 1] axis was not greater than about 0.5% due to the autodoping of gallium into the silicon layer. For the misfit coefficient of 0.5% or lower, the mol percent of the gallium oxide is from 71 to 98. A misfit coefficient of about 1.0% was permissible when the requirements were not severe for the electrical characteristics of the silicon layer.

It has been proven that use may be made of titanium oxide ($Ti_2O_3$), scandium oxide ($Sc_2O_3$), chromium oxide ($Cr_2O_3$), iron oxide ($Fe_2O_3$), magnesium titanium oxide ($MgTiO_3$), or iron titanium oxide ($FeTiO_3$) instead of the gallium oxide. The contents of these oxides for a misfit coefficient of 0.5% or less along the [1 0 1 1] axis of sapphire are from 42 to 55, from 25 to 33, from 83 to 99, from 60 to 78, from 56 to 73, and from 50 to 65 mol percent, respectively. Those for a misfit coefficient of 0% in the direction in question are 49, 29, 95, 69, 65, and 57 mol percent, respectively.

For epitaxial growth of a single crystal of gallium phosphide (GaP) on an additive-containing sapphire single crystal substrate according to this invention, the contents in the substrate of the gallium oxide, titanium oxide, scandium oxide, chromium oxide, iron oxide, magnesium titanium oxide, and iron titanium oxide are from 88 to 99, from 50 to 62, from 29 to 37, from 96 to 99, from 71 to 89, from 66 to 83, and from 58 to 74 mol percent, respectively, for realizing a misfit coefficient of 0.5% or less along the [1 0 1 1] axis of sapphire. Although it is impossible to reduce the misfit coefficient to 0% by the use of the gallium or chromium oxide, it is feasible to do so by the use of any one of the other oxides of 56, 33, 80, 74, and 66 mol percent, respectively.

For epitaxial growth of a single crystal of aluminium phosphide (AlP), it is infeasible to use chromium oxide for achieving a misfit coefficient of 0.5% or less along the [1 0 1 1] axis of sapphire. The contents of the gallium oxide, titanium oxide, scandium oxide, iron oxide, magnesium titanium oxide, and iron titanium oxide for the misfit coefficient of 0.5% or less are from 92 to 99, from 52 to 65, from 31 to 35, from 74 to 92, from 69 to 86, and from 61 to 76 mol percent, respectively. For the misfit coefficient of 0%, where the gallium oxide does not serve well, the contents of the remaining oxides are 58, 35, 83, 77, and 69 mol percent, respectively.

For epitaxial growth of a single crystal of zinc sulphide (ZnS), the contents of the oxides of gallium, titanium, and scandium are from 72 to 94, from 40 to 53, and from 24 to 32 mol percent for reducing the misfit coefficient to 0.5% or less. The corresponding contents are 83, 47, and 28 mol percent for attaining the 0% misfit coefficient.

What is claimed is:

1. A grown crystal structure comprising a sapphire-containing rhombohedral single-crystal electrically insulating substrate and an epitaxially grown semiconductor layer of silicon on said substrate, said single-crystal electrically insulating substrate consisting essentially of $GA_2O_3$ in an amount of between 71 and 98 mol % with the balance being essentially $Al_2O_3$, whereby the lattice misfit coefficient between said substrate and said epitaxially grown silicon layer is not more than about 1% along the axis of said substrate.

2. A grown crystal structure as claimed in claim 1, wherein said electrically insulating substrate consists of from 29 to 2 mol percent of the aluminium oxide and from 71 to 98 mol percent of the gallium oxide, and wherein said semi-conductor is silicon.

3. A grown crystal structure as claimed in claim 2, wherein said electrically insulating material consists of 13 mol percent of the aluminium oxide and 87 mol percent of the gallium oxide.

* * * * *

UNITED STATES PATENT AND TRADEMARK OFFICE
CERTIFICATE OF CORRECTION

PATENT NO. : 4,333,989

DATED : June 8, 1982

INVENTOR(S) : JUN-ICHI NISHIZAWA et al

It is certified that error appears in the above—identified patent and that said Letters Patent is hereby corrected as shown below:

Title Page, Left Column, Line 4: delete "Kitsuhiro" and in its place insert --Mitsuhiro--.

Title Page, Left Column, Line 9: after "Filed:" delete "Feb. 22, 1982" and in its place insert --July 14, 1980--.

Column 1, line 7: after "1978" insert --(now abandoned)--.

Column 1, line 24: delete "($mgAl_2O_3$)" and insert --($MgAl_2O_3$)--.

Column 3, line 18: delete "[$1\bar{2}01$]" and insert --[$1\bar{2}10$]--.

Column 3, line 27: delete "[$1\bar{2}01$]" and insert --[$1\bar{2}10$]--.

Column 4, line 31: delete "[1011]" and insert --[$10\bar{1}1$]--.

Column 4, line 46: delete "[1011]" and insert --[$10\bar{1}1$]--.

Column 4, line 55: delete "[1011]" and insert --[$10\bar{1}1$]--.

Signed and Sealed this

Twenty-ninth Day of March 1983

[SEAL]

Attest:

GERALD J. MOSSINGHOFF

Attesting Officer

Commissioner of Patents and Trademarks